United States Patent [19]

Reichbach

[11] Patent Number: 4,549,036

[45] Date of Patent: Oct. 22, 1985

[54] CIRCULAR INTEGRATED CIRCUIT PACKAGE

[76] Inventor: Morris M. Reichbach, 825 Woodland Dr., Lakewood, N.J. 08701

[21] Appl. No.: 633,487

[22] Filed: Jul. 23, 1984

[51] Int. Cl.⁴ ............................................. H01L 23/50
[52] U.S. Cl. ............................ 174/52 FP; 339/185 R
[58] Field of Search ............ 339/185 T, 185 R, 184 T, 339/184 M, 193 R, 193 N, 193 VS; 357/74; 174/52 FP, 50.6, 52 H

[56] References Cited

U.S. PATENT DOCUMENTS

| | | | |
|---|---|---|---|
| 3,141,983 | 7/1964 | Ward | 339/193 R X |
| 3,437,883 | 4/1969 | Smith | 174/52 H X |
| 3,725,309 | 4/1973 | Ames et al. | 174/52 H X |
| 3,730,969 | 5/1973 | Buttle et al. | 174/52 FP X |
| 4,082,394 | 4/1978 | Gedney et al. | 174/52 FP X |
| 4,265,512 | 5/1981 | Chiron et al. | 357/74 X |
| 4,396,935 | 8/1983 | Schuck | 357/74 |

Primary Examiner—A. T. Grimley
Assistant Examiner—D. A. Tone
Attorney, Agent, or Firm—Richard L. Miller

[57] ABSTRACT

A circular integrated circuit package which allows a large number of internal and external connections to be made to an integrated circuit chip by arranging the pin connections as rings of concentric circles. This arrangement provides the highest possible packing density and minimizes parasitic inductances and capacitances. The circular geometry also provides for greater predictability of parasitic effects and propagation delays due to the circular symmetry of the packaging. Insertion into a printed circuit board is facilitated by decreasing the length of each successive ring of pins as the radial distance from the center of the concentric rings increases so that one ring of pins is inserted at a time. Internally, the length of internal pins may similarly be arranged, but in reverse order, so that lead length is minimized. A variety of keyway types is provided.

1 Claim, 5 Drawing Figures

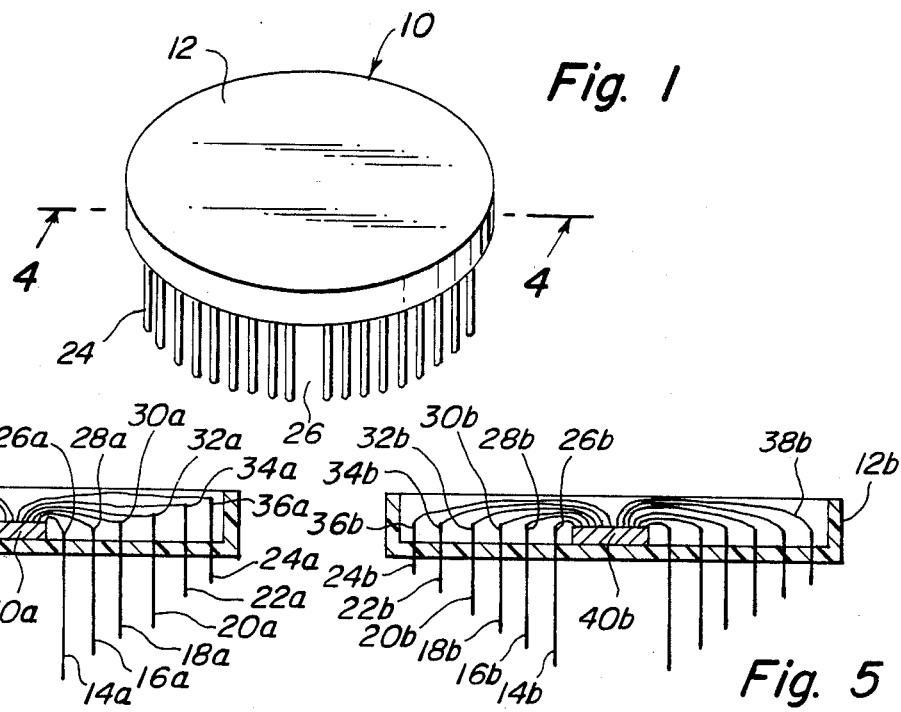
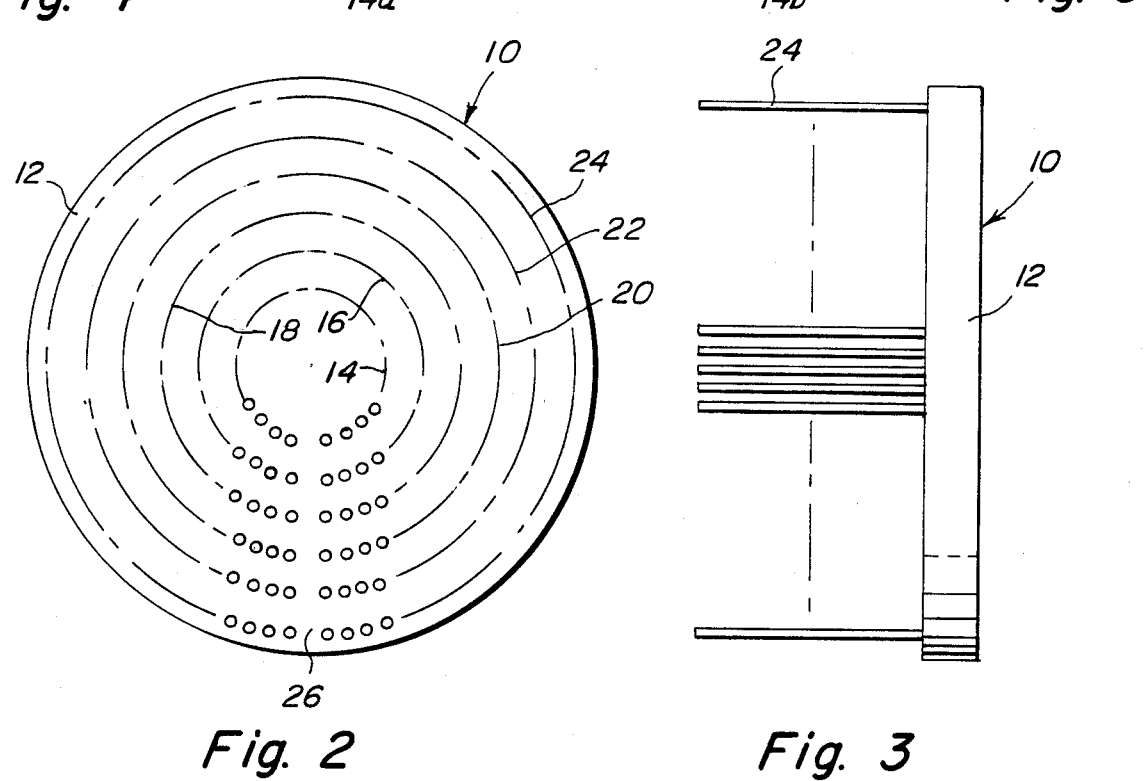

CIRCULAR INTEGRATED CIRCUIT PACKAGE

BACKGROUND OF THE INVENTION

The present invention relates generally to the field of packaging for electronic devices, and, more specifically, to packages for large scale integrated circuits.

At the present state of the art integrated circuits are provided in rectangular dual-inline pin (DIP) packages or in rectangular surface mounting flat packs. Very large scale integrated circuits, herein referred to as VLSI, containing thousands of gate equivalents are now requiring up to forty pins, half of which are located on each side of the rectangular package.

As the number of gate equivalents per VLSI chip increases, the number of pins is expected to increase and, therefore the length of the package is also expected to increase. Large rectangular packages have a number of disadvantages. First, long packages contain long leads between the IC chip itself and the external circuit creating a large parasitic capacitance component and a large parasitic inductance component. These parasitic components are particularly troublesome in high frequency circuits where parasitic reactances approach circuit design reactances. Second, a large number of pins requires that the ratio of silicon area to packaging area increase at a drastic rate, while the most requirements are for increasing complex dense packaging. Thirdly, rectangular packages require lead placements which introduce non-symmetrical design considerations since there is little symmetry in a rectangular configuration compared, say, to a circular or spherical configuration.

A number of devices have been provided which address these problems, but none are as suitable as is the instant invention for the purposes intended.

SUMMARY OF THE INVENTION

It is, therefore, a primary object of the present invention to provide a circular integrated circuit package in which the header to which an integrated circuit is bonded is circular.

Another object is to provide a circular integrated circuit package in which the pins are arranged in concentric circles since a circle provides the greatest surface area for any given perimeter.

A further object is to provide a circular integrated circuit package which is easy to insert into a printed circuit board in which concentric circles of holes have been provided. This is accomplished by making each concentric ring of pins shorter as the distance from each ring to the center of the rings increases. The insertion of each ring takes place one ring at a time and as each ring is inserted the juncture between the next ring and the printed circuit board is clearly visible.

A further object is to provide a circular integrated circuit package in which the internal connections from the portions of the pins which protrude from the header are successively shorter as the distance from each ring of pins to the center of the rings decreases, thus allowing connections to span outwards in layers.

A yet further object is to provide a circular integrated circuit package with a keyway so that the integrated circuit package can only be inserted one way.

A yet further object is to provide a circular integrated circuit package in which parasitic inductances and capacitances are held to a minimum.

A yet further object is to provide a circular integrated circuit package in which any remaining parasitic inductances and capacitances as well as propagation delays due to lead length are easily predictable due to the circular symmetry of the packaging.

Further objects of the invention will appear as the description proceeds.

To the accomplishment of the above and related objects, this invention may be embodied in the form illustrated in the accompanying drawings, attention being called to the fact, however, that the drawings are illustrative only and that changes may be made in the specific construction illustrated and described within the scope of the appended claims.

BRIEF DESCRIPTION OF THE DRAWING FIGURES

The figures in the drawings are briefly described as follows:

FIG. 1 is a perspective view of the invention.

FIG. 2 is a bottom view of the invention illustrated with many of the pins omitted for clarity.

FIG. 3 is a side view, also with most pins omitted for clarity, of an embodiment in which the mounting pins are all equal in length.

FIG. 4 is a partial cross sectional view, taken on line 4—4 in FIG. 1, of one embodiment of the invention with connecting pins and internal pins varying in height.

FIG. 5 is a partial cross sectional view, similar to FIG. 4, of another embodiment of the invention with internal pins of constant height and connecting pins of varying heights.

DETAILED DESCRIPTION OF THE PREFERRED EMBODIMENTS

In FIG. 1 the invention 10 is a circular integrated circuit package shown with disc shaped header 12 and a multiplicity of connecting pins which may best be understood with reference to FIGS. 2 and 3. Even though header 12 is shown disc shaped any shape could be substituted and yet retain the advantages of the lead placement. In FIG. 2 the connecting lead arrangement may be clearly seen as a set of concentric rings of connecting pins 14, 16, 18, 20, 22 and 24. A large number of pins may be placed in each of the concentric rings and, although six concentric rings are shown for illustrative purposes, any number of concentric rings may be used. A keyway 26 is created by providing a space between pairs of pins which are spaced equally along the perimeter of each ring. An alternative keying system could consist of varying the spacing in some other methodical fashion.

An improved method of insertion may best be understood with reference to FIGS. 4 and 5. Ordinarily, inserting a device package with pins which could number in the hundreds would be a very difficult task. However, by making each concentric circle of pins longer as the distance from each ring to the center of the concentric circles decreases solves this problem. Therefore, pins in concentric rings 14a, 16a, 18a, 20a, 22a and 24a in header 12a become successively shorter. This also applies to rings 14b, 16b, 18b, 20b, 22b and 24b in header 12b. First, pins in inner ring 14a are inserted, then pins in ring 16a, then ring 18a, etc. After each ring of pins is inserted, the next outer ring may be easily inserted because it is in clear view extending below the bottom edge of any more outward ring. If a pin is bent it may be easily seen and corrected.

Most existing packages have internal connections made from the IC chip itself, 40a or 40b, to pins lying in a flat plane, such as the internal pin connections of rings 26b, 28b, 30b, 32b, 34b and 36b in FIG. 5. This connection mode has the disadvantage that in order to provide vertical spacing between leads, each internal connecting lead, such as lead 38b must loop up then down, which increases undesirable lead length. An improvement is provided by the arrangement shown in FIG. 4 in which internal pin connections of rings 26a, 28a, 30a, 32a, 34a and 36a become successively longer so that internal leads such as 38a loop upwards only, thereby keeping lead length to an absolute minimum.

While certain novel features of this invention have been shown and described and are pointed out in the annexed claims, it will be understood that various omissions, substitutions and changes in the forms and details of the device illustrated and in its operation can be made by those skilled in the art without departing from the spirit of the invention.

What is claimed is:

1. A circular integrated circuit package, comprising in combination:
   (a) an insulating header to which may be bonded an integrated circuit;
   (b) a multiplicity of connecting pins arranged in concentric circles wherein said connecting pins protrude through said header so that the portion of said pins protruding above said header may be connected to pads located on said integrated circuit and the portion of said pins protruding below said header may be connected to an external circuit; and,
   (c) means for keying said circular integrated package so that said package may be mounted to a printed circuit board in one position only, wherein said portion of said pins protruding below said header have differing lengths; wherein said length protruding below said header of any of said pins located on the circumference of any given circle of pins is equal to the length protruding below said header of every other pin located on the circumference of the same said circle of pins; and, said length protruding below said header of each of said pins decreases as the radial distance to the center of said concentric circles increases.

* * * * *